United States Patent
Metz et al.

(10) Patent No.: US 7,064,066 B1
(45) Date of Patent: Jun. 20, 2006

(54) METHOD FOR MAKING A SEMICONDUCTOR DEVICE HAVING A HIGH-K GATE DIELECTRIC AND A TITANIUM CARBIDE GATE ELECTRODE

(75) Inventors: Matthew V. Metz, Hillsboro, OR (US); Suman Datta, Beaverton, OR (US); Mark L. Doczy, Beaverton, OR (US); Jack Kavalieros, Portland, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/006,074

(22) Filed: Dec. 7, 2004

(51) Int. Cl.
*H01L 21/44* (2006.01)
(52) U.S. Cl. .................... 438/680; 438/685
(58) Field of Classification Search ............ 438/680, 438/685, 637, 675
See application file for complete search history.

(56) References Cited

U.S. PATENT DOCUMENTS

| | | | |
|---|---|---|---|
| 6,063,698 A | 5/2000 | Tseng et al. | 438/585 |
| 6,184,072 B1 | 2/2001 | Kaushik et al. | 438/197 |
| 6,255,698 B1 | 7/2001 | Gardner et al. | 257/369 |
| 6,365,450 B1 | 4/2002 | Kim | 438/216 |
| 6,410,376 B1 | 6/2002 | Ng et al. | 438/199 |
| 6,420,279 B1 | 7/2002 | Ono et al. | 438/785 |
| 6,475,874 B1 | 11/2002 | Xiang et al. | 438/396 |
| 6,514,828 B1 | 2/2003 | Ahn et al. | 438/240 |
| 6,544,906 B1 | 4/2003 | Rotondaro et al. | 438/785 |
| 6,586,288 B1 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,620,713 B1 | 9/2003 | Arghavani et al. | 438/585 |
| 6,642,131 B1 | 11/2003 | Harada | 438/591 |
| 6,667,246 B1 | 12/2003 | Mitsuhashi et al. | 438/756 |
| 6,689,675 B1 | 2/2004 | Parker et al. | 438/585 |
| 6,696,327 B1 | 2/2004 | Brask et al. | 438/197 |
| 6,696,345 B1 | 2/2004 | Chau et al. | 438/387 |
| 6,709,911 B1 | 3/2004 | Doczy et al. | 438/197 |
| 6,713,358 B1 | 3/2004 | Chau et al. | 438/287 |
| 6,716,707 B1 | 4/2004 | Brask et al. | 438/287 |
| 6,746,967 B1 | 6/2004 | Brask et al. | 438/752 |
| 6,770,568 B1 | 8/2004 | Brask | 438/746 |
| 6,787,440 B1 | 9/2004 | Lindert et al. | 438/591 |
| 6,794,234 B1 | 9/2004 | Polishchuk et al. | 438/199 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |

(Continued)

FOREIGN PATENT DOCUMENTS

EP  0 899 784 A2  3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—Hsien-Ming Lee
(74) *Attorney, Agent, or Firm*—Justin K. Brask

(57) ABSTRACT

A method for making a titanium carbide layer is described. That method comprises alternately introducing a carbon containing precursor and a titanium containing precursor into a chemical vapor deposition reactor, while a substrate is maintained at a selected temperature. The reactor is operated for a sufficient time, and pulse times are selected for the carbon containing precursor and the titanium containing precursor, to form a titanium carbide layer of a desired thickness and workfunction on the substrate.

36 Claims, 4 Drawing Sheets

U.S. PATENT DOCUMENTS

| | | | |
|---|---|---|---|
| 2003/0032303 A1 | 2/2003 | Yu et al. | 438/770 |
| 2003/0045080 A1 | 3/2003 | Visokay et al. | 438/591 |
| 2003/0172509 A1* | 9/2003 | Maletin et al. | 29/25.03 |
| 2004/0137728 A1* | 7/2004 | Gallagher et al. | 438/689 |
| 2004/0150023 A1* | 8/2004 | Li et al. | 257/296 |
| 2005/0006337 A1* | 1/2005 | Takeda | 216/23 |
| 2005/0145894 A1* | 7/2005 | Chau et al. | 257/288 |
| 2005/0164466 A1* | 7/2005 | Zheng et al. | 438/398 |

FOREIGN PATENT DOCUMENTS

| | | |
|---|---|---|
| GB | 2 358 737 A | 4/2001 |

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies wit Gigabit Feature Sizes", Technical University of Hanburg-Harburg, 5 pages.

* cited by examiner

METHOD FOR MAKING A SEMICONDUCTOR DEVICE HAVING A HIGH-K GATE DIELECTRIC AND A TITANIUM CARBIDE GATE ELECTRODE

FIELD OF THE INVENTION

The present invention relates to methods for making semiconductor devices, in particular, those with titanium carbide containing gate electrodes or barrier layers.

BACKGROUND OF THE INVENTION

An MOS field-effect transistor may include a high-k gate dielectric and a metal gate electrode. The metal gate electrode may comprise a titanium carbide layer, which may be formed on the high-k gate dielectric using an atomic layer chemical vapor deposition ("ALCVD") process. Although an ALCVD process may be used to deposit such a layer on such a dielectric, it may be difficult to generate a titanium carbide layer with the desired thickness and workfunction using such a process.

Accordingly, there is a need for an improved process for making a semiconductor device that includes a titanium carbide containing gate electrode or barrier layer. There is a need for an ALCVD process that may be tailored to produce a titanium carbide layer with the desired thickness and workfunction. The method of the present invention provides such a process.

Features shown in these figures are not intended to be drawn to scale.

DETAILED DESCRIPTION OF THE PRESENT INVENTION

A method for making a titanium carbide layer is described. That method comprises alternately introducing a carbon containing precursor and a titanium containing precursor at selected pulse times into a chemical vapor deposition reactor, while maintaining a substrate at a selected temperature. The reactor is operated for a sufficient time, and pulse times are selected for the carbon containing precursor and the titanium containing precursor, to form a titanium carbide layer of a desired thickness and workfunction on the substrate.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
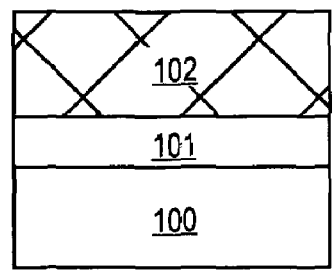
FIGS. 1a–1b represent cross-sections of structures that may be formed when carrying out an embodiment of the method of the present invention.
Figure 1B:
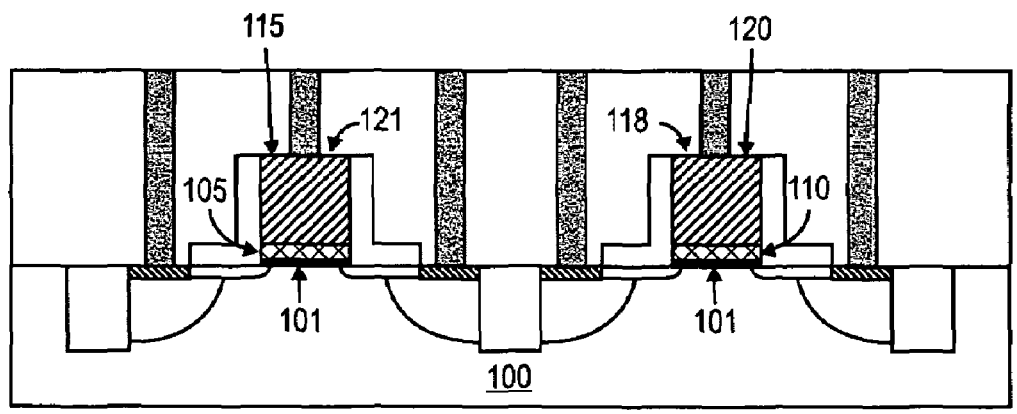

FIGS. 1a–1b represent cross-sections of structures that may be formed when carrying out an embodiment of the method of the present invention. FIG. 1a represents substrate 100 upon which is formed high-k gate dielectric layer 101 and titanium carbide layer 102. Substrate 100 may comprise any material that may serve as a foundation upon which a semiconductor device may be built. Substrate 100 may, for example, comprise silicon and/or germanium.

High-k gate dielectric layer 101 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, lanthanum oxide, zirconium oxide, and aluminum oxide. Although a few examples of materials that may be used to form high-k gate dielectric layer 101 are described here, that layer may be made from other materials that serve to reduce gate leakage.

High-k gate dielectric layer 101 may be formed on substrate 100 using a conventional ALCVD process. In such a process, a metal oxide precursor (e.g., a metal chloride) and steam may be alternately fed at selected flow rates into a CVD reactor, which is operated at a selected pressure while substrate 100 is maintained at a selected temperature. The CVD reactor should be operated long enough to form a layer with the desired thickness. In most applications, dielectric layer 101 should be less than about 40 angstroms thick, and more preferably between about 5 angstroms and about 20 angstroms thick.

In the method of the present invention, titanium carbide layer 102 is formed on high-k gate dielectric layer 101 by alternately introducing a carbon containing precursor and a titanium containing precursor into a CVD reactor, while substrate 100 is maintained at a selected temperature. Pulse times should be selected for the carbon containing precursor and the titanium containing precursor, and the reactor should be operated for a sufficient time, to generate a titanium carbide layer of a desired thickness and workfunction.

The carbon containing precursor may comprise a metal alkyl or metalloid alkyl complex, such as trimethylaluminum ("TMA") or triethylboron. The titanium containing precursor may comprise a titanium halide, such as titanium tetrachloride ("$TiCl_4$"). The pulse time for the carbon containing precursor for a given growth cycle, when introduced into the CVD reactor, may be less than about 1 second, on the order of 10 to 20 seconds, or somewhere in between—depending upon whether the desired titanium carbide layer will be a p-type, n-type, or mid-gap film.

The pulse time for the titanium containing precursor should be sufficient to provide enough titanium to generate the desired titanium carbide layer. In many applications, a pulse time between about 2 and 3 seconds should be adequate. The substrate temperature preferably should be maintained at between about 100° C. and about 700° C. The optimum substrate temperature, like the optimum pulse time for the carbon containing precursor, may depend upon whether the desired titanium carbide layer will be a p-type, n-type, or mid-gap film.

The method of the present invention may be tailored to produce titanium carbide layers with different thicknesses and workfunctions. For example, to form a p-type titanium carbide layer, the temperature of substrate 100 preferably should be maintained between about 100° C. and about 250° C. To form a p-type titanium carbide layer using a TMA precursor, that precursor preferably should be introduced into the reactor for a relatively short pulse time, e.g., a pulse time that is between about 0.5 seconds and about 1 second. As mentioned above, the titanium containing precursor (e.g., titanium tetrachloride) may have a pulse time that is between about 2 and 3 seconds.

When titanium carbide layer 102 will set the workfunction for a PMOS gate electrode, titanium carbide layer 102 must be sufficiently thick to set the workfunction for the gate electrode. To form a sufficiently thick titanium carbide layer, a minimum number of growth cycles (each growth cycle comprising a TMA pulse followed by a purging gas pulse, and a $TiCl_4$ pulse followed by a purging gas pulse) must be performed. After completing between about 20 and about 40 growth cycles using the operating conditions described above, a p-type titanium carbide layer that is between about 10 angstroms and about 20 angstroms thick, and that sets a workfunction that is between about 4.9 eV and about 5.2 eV, may result.

If, alternatively, titanium carbide layer 102 should be an n-type layer, the temperature of substrate 100 preferably should be maintained above about 400° C. (e.g., between about 400° C. and about 700° C.) when forming that layer. To form an n-type titanium carbide layer using a TMA precursor, that precursor preferably should be introduced into the reactor for a relatively long pulse time, e.g., a pulse time that is between about 10 seconds and about 20 seconds. In some embodiments, a single pulse of TMA per growth cycle may be preferred; whereas, in other embodiments, multiple pulses of TMA per growth cycle (e.g., four separate 5 second pulses per growth cycle instead of a single 20 second pulse per growth cycle) may be preferred.

When forming an n-type titanium carbide layer using the method of the present invention, as when forming a p-type titanium carbide layer, the titanium containing precursor (e.g., titanium tetrachloride) may have a pulse time that is between about 2 and 3 seconds. One may form an n-type titanium carbide layer that is between about 50 angstroms and about 250 angstroms thick by completing between about 70 and about 250 growth cycles using these operating conditions. An n-type titanium carbide layer with that thickness may set a workfunction for an NMOS gate electrode that is between about 3.9 eV and about 4.3 eV.

When forming a titanium carbide layer with a mid-gap workfunction using the method of the present invention, the temperature of substrate 100 preferably should be maintained between about 250° C. and about 400° C. To make such a mid-gap titanium carbide layer, the pulse time for the carbon containing precursor preferably lies between the pulse times that may be applied when making p-type or n-type titanium carbide layers. Similarly, the number of growth cycles that may be required to form a mid-gap titanium carbide layer of the desired thickness may lie between the number of growth cycles required to make p-type or n-type titanium carbide layers.

FIG. 1b represents a semiconductor device that includes NMOS gate electrode 115 and PMOS gate electrode 120. NMOS gate electrode 115 comprises n-type titanium carbide layer 105. PMOS gate electrode 120 comprises p-type titanium carbide layer 110. N-type titanium carbide layer 105 and p-type titanium carbide layer 110 are each formed on high-k gate dielectric layer 101. Metal layer 121 is formed on n-type titanium carbide layer 105 and metal layer 118 is formed on p-type titanium carbide layer 110. Metal layers 121 and 118 may comprise, for example, titanium nitride. A replacement metal gate process, which may be used to form a structure like the one that FIG. 1b illustrates, is described in detail below.

Although the method of the present invention may be used to form a metal gate electrode that includes a titanium carbide layer, the method may alternatively be used to form titanium carbide containing barrier layers or liners. Such barrier layers or liners may serve to insulate one film from another to prevent them from reacting. When forming a titanium carbide barrier layer using the method of the present invention, it may be desirable to use triethylboron instead of TMA to generate a titanium carbide film with less impurity. Such a titanium carbide barrier layer may be relatively thin, e.g., between about 10 angstroms and about 40 angstroms thick.

Figure 2A:
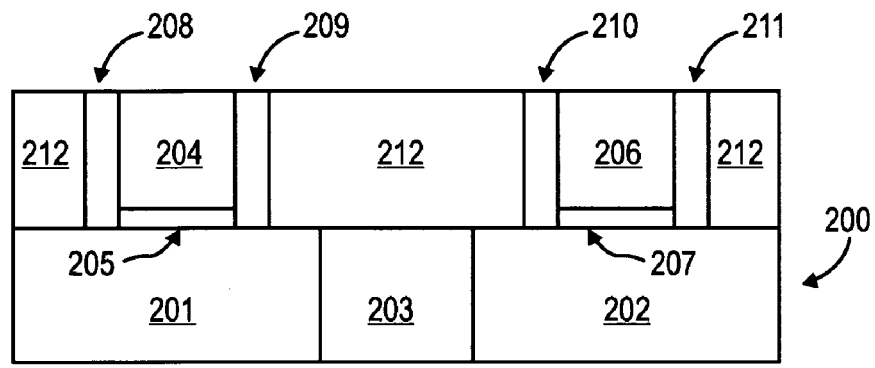
FIGS. 2a–2i represent cross-sections of structures that may be formed when carrying out an embodiment of the method of the present invention to make a semiconductor device using a replacement metal gate process.

FIGS. 2a–2i illustrate how the method of the present invention may be applied to make a semiconductor device using a replacement metal gate process. FIG. 2a represents an intermediate structure that may be formed when making a CMOS device. That structure includes first part 201 and second part 202 of substrate 200. Isolation region 203 separates first part 201 from second part 202. Polysilicon layers 204 and 206 are formed on dielectric layers 205 and 207, respectively. Polysilicon layer 204 is bracketed by sidewall spacers 208 and 209, and polysilicon layer 206 is bracketed by sidewall spacers 210 and 211. Dielectric 212 separates layers 204 and 206.

Substrate 200 may comprise any material that may serve as a foundation upon which a semiconductor device may be built. Isolation region 203 may comprise silicon dioxide, or other materials that may separate the transistor's active regions. Dielectric layers 205 and 207 may each comprise silicon dioxide, or other materials that may insulate the substrate from other substances. Polysilicon layers 204 and 206 preferably are each between about 100 and about 2,000 angstroms thick, and more preferably between about 500 and about 1,600 angstroms thick. In this embodiment, polysilicon layer 204 is doped n-type (e.g., with arsenic, phosphorus or another n-type material), while polysilicon layer 206 is doped p-type (e.g., with boron or another p-type material). Spacers 208, 209, 210, and 211 preferably comprise silicon nitride, while dielectric 212 may comprise silicon dioxide or a low-k material.

Conventional process steps, materials, and equipment may be used to generate the FIG. 2a structure, as will be apparent to those skilled in the art. As shown, dielectric 212 may be polished back, e.g., via a conventional CMP step, to expose polysilicon layers 204 and 206. Although not shown, the FIG. 2a structure may include many other features (e.g., a silicon nitride etch stop layer, source and drain regions, and one or more buffer layers) that may be formed using conventional processes.

After forming the FIG. 2a structure, n-type polysilicon layer 204 is removed. In a preferred embodiment, that layer is removed by applying a wet etch process. Such a wet etch process may comprise exposing layer 204 to an aqueous solution that comprises a source of hydroxide for a sufficient time at a sufficient temperature to remove substantially all of that layer without removing a significant amount of p-type polysilicon layer 206. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

N-type polysilicon layer 204 may be removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm². For example, if n-type polysilicon layer 204 is about 1,350 angstroms thick, it may be removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$.

Figure 2B:
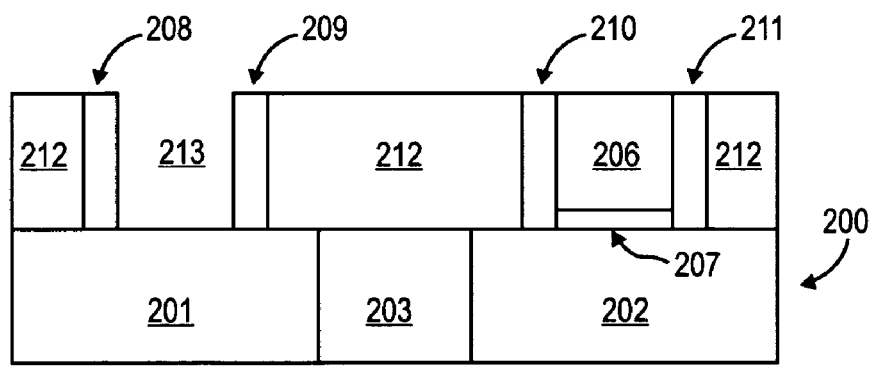

After removing n-type polysilicon layer 204, dielectric layer 205 is removed. If dielectric layer 205 comprises silicon dioxide, it may be removed using an etch process that is selective for silicon dioxide. Such an etch process may comprise exposing layer 205 to a solution that includes about 1 percent HF in deionized water. The time layer 205 is exposed should be limited, as the etch process for removing that layer may also remove part of dielectric layer 212. With that in mind, if a 1 percent HF based solution is used to remove layer 205, the device preferably should be exposed to that solution for less than about 60 seconds, and more preferably for about 30 seconds or less. As shown in FIG. 2b, removal of dielectric layer 205 forms trench 213 within dielectric layer 212 positioned between sidewall spacers 208 and 209.

Figure 2C:
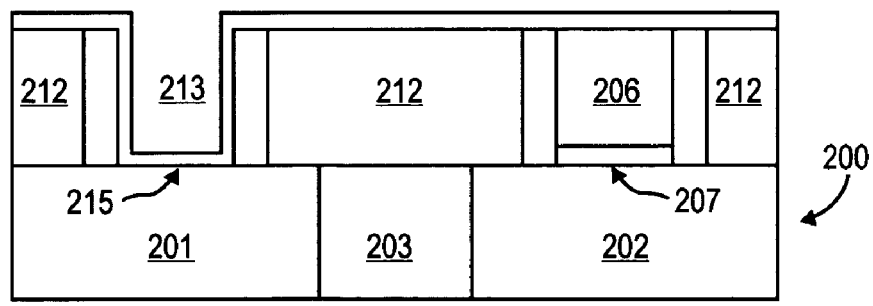

After removing dielectric layer 205, high-k gate dielectric layer 215 is formed within trench 213 and on substrate 200. Any of the materials identified above may be used to make high-k gate dielectric layer 215. High-k gate dielectric layer 215 may be formed using a conventional ALCVD process, as described above. High-k gate dielectric layer 215 preferably should be less than about 40 angstroms thick, and more preferably between about 5 angstroms and about 20 angstroms thick. As shown in FIG. 2c, when an ALCVD process is used to form high-k gate dielectric layer 215, that layer will form on the sides of trench 213 in addition to forming on the bottom of that trench, and will form on dielectric layer 212.

Figure 2D:
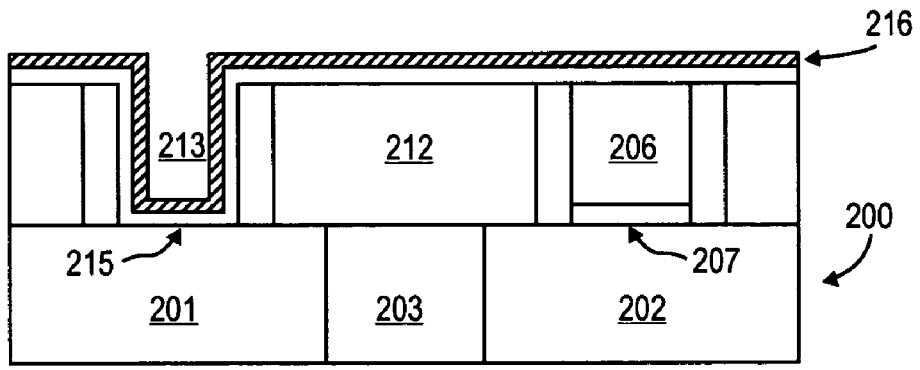

In the illustrated embodiment, n-type titanium carbide layer 216 is formed directly on high-k gate dielectric layer 215 to generate the FIG. 2d structure. Like high-k gate dielectric layer 215, part of n-type titanium carbide layer 216 lines trench 213 while part of that layer spills over onto dielectric layer 212. When forming n-type titanium carbide layer 216 on high-k gate dielectric layer 215 using an ALCVD process, the temperature of substrate 200 preferably is maintained above about 400° C. While maintaining substrate 200 at the appropriate temperature, TMA and TiCl$_4$ are alternately pulsed into the reactor. The pulse time for TMA is preferably between about 10 seconds and about 20 seconds. That pulse time may reflect a single pulse of TMA per growth cycle or, alternatively, multiple pulses of TMA per growth cycle.

When forming n-type titanium carbide layer 216, TiCl$_4$ may have a pulse time that is between about 2 and 3 seconds. By continuing this process for between about 70 and about 250 growth cycles, n-type titanium carbide layer 216 may reach a thickness that is between about 50 angstroms and about 250 angstroms. The resulting n-type titanium carbide layer may have a workfunction that is between about 3.9 eV and about 4.3 eV.

Figure 2E:
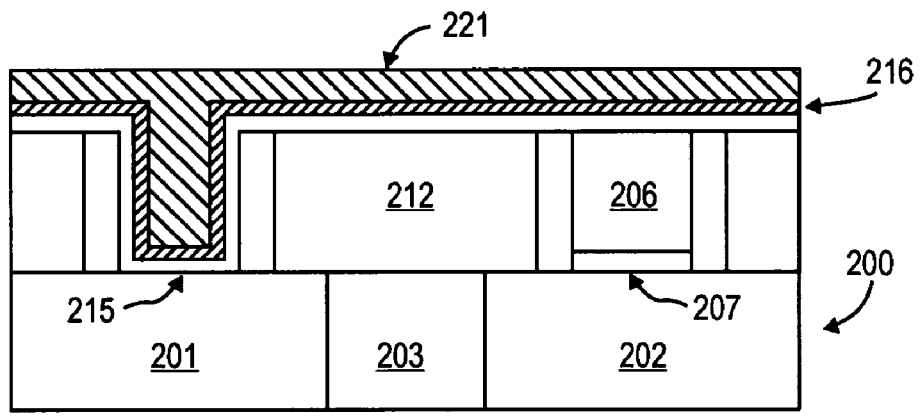

In this embodiment, after forming n-type titanium carbide layer 216 on high-k gate dielectric layer 215, fill metal 221 is formed on n-type titanium carbide layer 216. Fill metal 221 fills the remainder of trench 213 and covers dielectric layer 212, as illustrated in FIG. 2e. Fill metal 221 preferably comprises a material that may be easily polished, and preferably is deposited over the entire device using a conventional metal deposition process. Such a fill metal may comprise, for example, titanium nitride, tungsten, titanium, aluminum, tantalum, tantalum nitride, cobalt, copper, or nickel.

In a particularly preferred embodiment, fill metal 221 comprises titanium nitride. Titanium nitride may be deposited using an appropriate CVD or PVD process that does not significantly affect underlying n-type titanium carbide layer 216 or high-k gate dielectric layer 215. In addition, when polysilicon layer 206 is subsequently removed (as described below), titanium nitride may be more resistant than other metals to the etch chemistry used to remove that layer.

Figure 2F:
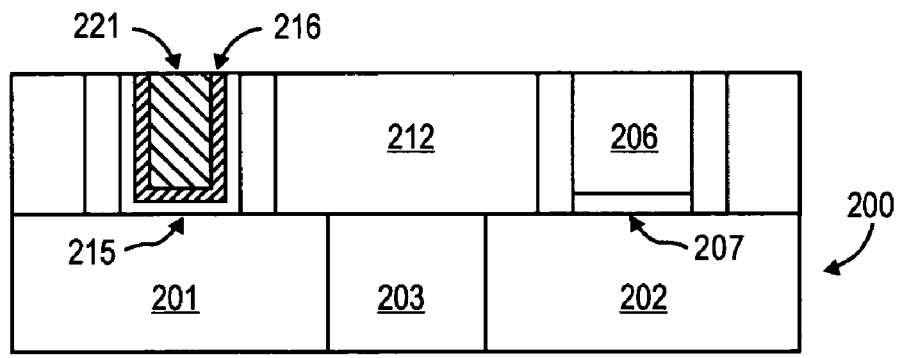

After forming the FIG. 2e structure, fill metal 221, n-type titanium carbide layer 216, and high-k gate dielectric layer 215 are removed from above dielectric layer 212 to generate the FIG. 2f structure. An appropriate CMP or etch process may be used to remove those layers from dielectric layer 212. In a preferred embodiment, a combination of CMP and etch processes are used, e.g., a CMP step to remove fill metal 221 followed by an etch step (or steps) to remove n-type titanium carbide layer 216 and high-k gate dielectric layer 215.

After removing fill metal 221, n-type titanium carbide layer 216, and high-k gate dielectric layer 215 from above dielectric layer 212, p-type polysilicon layer 206 is removed. P-type polysilicon layer 206 may be removed selectively to fill metal 221 by exposing layer 206 to a solution that comprises between about 20 and about 30 percent TMAH by volume in deionized water for a sufficient time at a sufficient temperature (e.g., between about 60° C. and about 90° C.), while applying sonic energy.

Figure 2G:
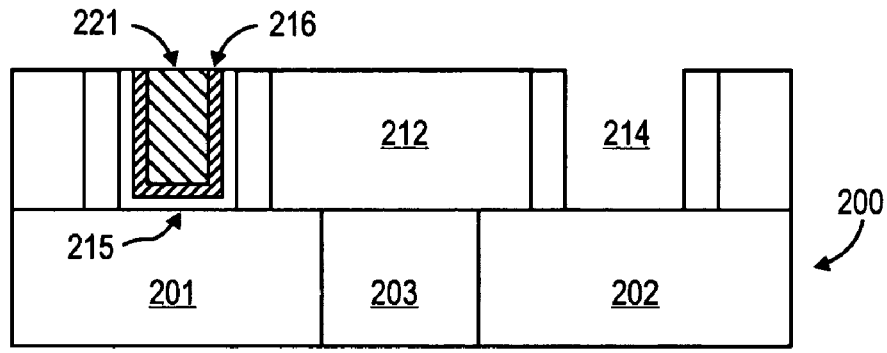

After removing polysilicon layer 206, dielectric layer 207 is removed, e.g., by using the same process that was used to remove dielectric layer 205. Removing dielectric layer 207 generates trench 214, as FIG. 2g illustrates. Following the removal of that dielectric layer, high-k gate dielectric layer 217 is formed within trench 214 and onto dielectric layer 212. The same process steps and materials used to form high-k gate dielectric layer 215 may be used to form high-k gate dielectric layer 217.

In this embodiment, p-type titanium carbide layer 220 is then deposited on high-k gate dielectric layer 217. Like n-type titanium carbide layer 216, p-type titanium carbide layer 220 may be formed using an ALCVD process. Unlike the process for forming n-type titanium carbide layer 216, however, when forming p-type titanium carbide layer 220, substrate 200 preferably should be maintained at a substantially lower temperature, e.g., between about 100° C. and about 250° C.

In this embodiment, TMA and TiCl$_4$ are alternately pulsed into the reactor while maintaining substrate 200 at the appropriate temperature. The pulse time for TMA is preferably between about 0.5 seconds and about 1 second and the pulse time for TiCl$_4$ may be between about 2 and 3 seconds. By continuing this process for between about 20 and about 40 growth cycles, p-type titanium carbide layer 220 may reach a thickness that is between about 10 angstroms and about 20 angstroms. The resulting p-type titanium carbide layer may have a workfunction that is between about 4.9 eV and about 5.2 eV.

Figure 2H:
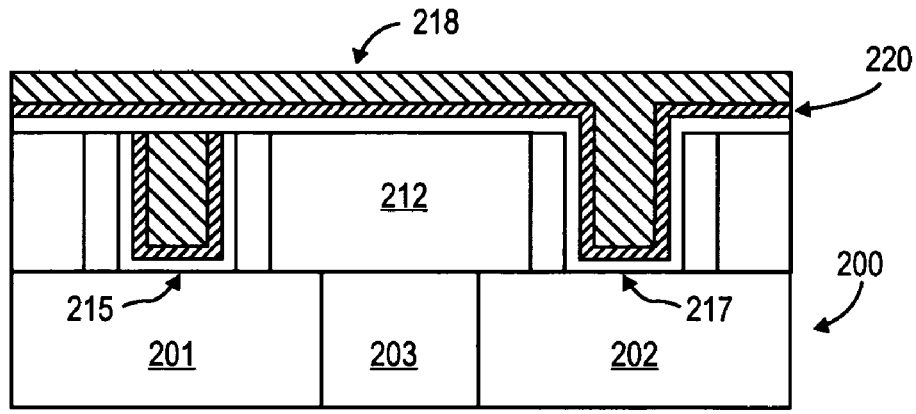
Figure 2I:
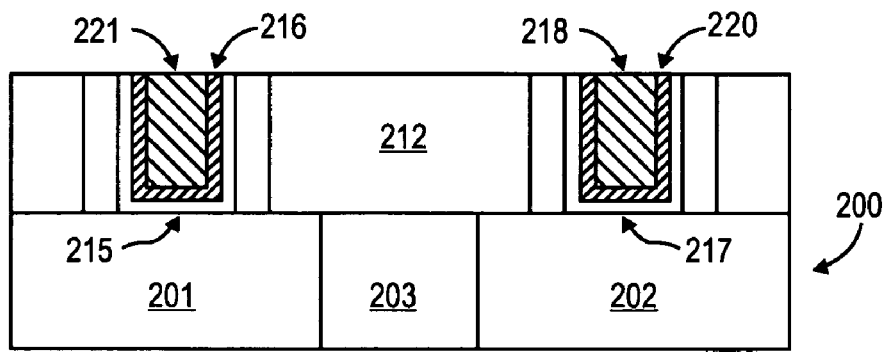

After forming p-type titanium carbide layer 220 on high-k gate dielectric layer 217, fill metal 218 may be formed on p-type titanium carbide layer 220 to generate the FIG. 2h structure. The same process steps and materials used to form fill metal 221 may be used to form fill metal 218. In a preferred embodiment, fill metal 218 comprises titanium nitride. Fill metal 218, p-type titanium carbide layer 220 and high-k gate dielectric layer 217 are then removed from dielectric layer 212 to generate the FIG. 2i structure. The same CMP and/or etch steps used to remove fill metal 221, n-type titanium carbide layer 216 and high-k gate dielectric layer 215 from above dielectric layer 212 may be used to remove fill metal 218, p-type titanium carbide layer 220 and high-k gate dielectric layer 217 from above dielectric layer 212.

After removing fill metal 218, p-type titanium carbide layer 220 and high-k gate dielectric layer 217 from above dielectric layer 212, a capping dielectric layer (not shown) may be deposited onto the resulting structure using a conventional deposition process. Process steps for completing the device that follow the deposition of such a capping dielectric layer, e.g., forming the device's contacts, metal interconnect, and passivation layer, are well known to those skilled in the art and will not be described here. Although a few examples of process steps for forming the FIG. 2i structure are presented here, many other process steps may be used to make that structure, as will be apparent to those skilled in the art.

The method of the present invention may enable one to make titanium carbide layers with different thicknesses and workfunctions, which may be used in various applications. Although the foregoing description has specified certain steps and materials that may be used in the method of the present invention, those skilled in the art will appreciate that many modifications and substitutions may be made. Accordingly, all such modifications, substitutions and additions fall within the spirit and scope of the invention as defined by the appended claims.

What is claimed is:

1. A method for making a titanium carbide layer comprising:
   alternately introducing a carbon containing precursor and a titanium containing precursor at selected pulse times into a chemical vapor deposition reactor, while a substrate is maintained at a selected temperature;
   wherein the reactor is operated for a sufficient time, and pulse times are selected for the carbon containing precursor and the titanium containing precursor, to form a titanium carbide layer of a desired thickness and workfunction on the substrate;
   wherein, the titanium carbide layer is between about 10 angstroms and about 20 angstroms thick, and is a p-type titanium carbide layer;
   the selected temperature is between about 100° C. and about 250° C.; and
   the pulse time for the carbon containing precursor is between about 0.5 seconds and about 1 second.

2. A method for making a semiconductor device comprising:
   forming a high-k gate dielectric layer on a substrate; and
   forming a titanium carbide containing gate electrode on the high-k gate dielectric layer by:
   alternately introducing a carbon containing precursor and a titanium containing precursor at selected pulse times into a chemical vapor deposition reactor, while the substrate is maintained at a temperature that is between about 100° C. and about 700° C.;
   wherein the pulse time for the carbon containing precursor is between about 0.5 seconds and about 20 seconds; and
   wherein the reactor is operated for a sufficient time to generate a titanium carbide layer that is between about 10 angstroms and about 250 angstroms thick.

3. The method of claim 2 wherein the carbon containing precursor is selected from the group consisting of trimethylaluminum and triethylboron, and the titanium containing precursor comprises titanium tetrachloride.

4. The method of claim 2 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

5. The method of claim 2 wherein:
   the titanium carbide layer is between about 10 angstroms and about 20 angstroms thick, and is a p-type titanium carbide layer;
   the selected temperature is between about 100° C. and about 250° C.; and
   the pulse time for the carbon containing precursor is between about 0.5 seconds and about 1 second.

6. The method of claim 2 wherein:
   the titanium carbide layer is between about 50 angstroms and about 250 angstroms thick, and is an n-type titanium carbide layer;
   the selected temperature is greater than about 400° C.; and
   the pulse time for the carbon containing precursor is between about 10 seconds and about 20 seconds.

7. A method for making a semiconductor device comprising:
   forming a dielectric layer on a substrate;
   forming a first trench and a second trench within the dielectric layer;
   forming a high-k gate dielectric layer within the first trench and within the second trench;
   forming an n-type titanium carbide layer on the high-k gate dielectric layer and within the first trench; and
   forming a p-type titanium carbide layer on the high-k gate dielectric layer and within the second trench.

8. The method of claim 7 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

9. The method of claim 7 wherein the high-k gate dielectric layer comprises a material that is selected from the group consisting of hafnium oxide, lanthanum oxide, zirconium oxide, and aluminum oxide.

10. The method of claim 7 wherein the n-type titanium carbide layer is formed on the high-k gate dielectric layer within the first trench before the p-type titanium carbide layer is formed on the high-k gate dielectric layer within the second trench.

11. The method of claim 7 wherein the n-type titanium carbide layer is between about 50 angstroms and about 250 angstroms thick, and has a workfunction that is between about 3.9 eV and about 4.2 eV.

12. The method of claim 7 wherein the p-type titanium carbide layer is between about 10 angstroms and about 20 angstroms thick, and has a workfunction that is between about 4.9 eV and about 5.2 eV.

13. The method of claim 7 further comprising forming a first fill metal on the n-type titanium carbide layer and forming a second fill metal on the p-type titanium carbide layer.

14. The method of claim 13 wherein the first fill metal is selected from the group consisting of titanium nitride, tungsten, titanium, aluminum, tantalum, tantalum nitride, cobalt, copper, and nickel; and the second fill metal comprises titanium nitride.

15. The method of claim 7 wherein:
the n-type titanium carbide layer is formed by alternately introducing a trimethylaluminum precursor at a first selected pulse time, and a titanium tetrachloride precursor at a second selected pulse time, into a chemical vapor deposition reactor, while the substrate is maintained at a temperature that is greater than about 400° C.; and
the p-type titanium carbide layer is formed by alternately introducing a trimethylaluminum precursor at a third selected pulse time that is shorter than the first selected pulse time, and a titanium tetrachloride precursor at a fourth selected pulse time, into a chemical vapor deposition reactor, while the substrate is maintained at a temperature that is between about 100° C. and about 250° C.

16. The method of claim 15 wherein:
the first selected pulse time is between about 10 seconds and about 20 seconds;
the third selected pulse time is between about 0.5 seconds and about 1 second;
between about 70 and about 250 growth cycles are performed to form the n-type titanium carbide layer; and
between about 20 and about 40 growth cycles are performed to form the p-type titanium carbide layer.

17. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said carbon containing precursor comprises a compound that is selected from the group consisting of a metal alkyl complex and a metalloid alkyl complex, and said titanium containing precursor comprises a titanium halide.

18. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said titanium carbide layer has a p-type workfunction.

19. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said titanium carbide layer has a workfunction between about 4.9 eV and about 5.2 eV.

20. The method of claim 19 wherein:
said titanium carbide layer is between about 10 angstroms and about 20 angstroms thick;
the selected pulse time for said carbon containing precursor is between about 0.5 seconds and about 1 second; and
said selected temperature is between about 100° C. and about 250° C.

21. The method of claim 20 wherein said carbon containing precursor comprises a compound that is selected from the group consisting of a metal alkyl complex and a metalloid alkyl complex, and said titanium containing precursor comprises a titanium halide.

22. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said titanium carbide layer has an n-type workfunction.

23. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said titanium carbide layer has a workfunction between about 3.9 eV and about 4.3 eV.

24. The method of claim 23 wherein:
said titanium carbide layer is between about 50 angstroms and about 250 angstroms thick;
the selected pulse time for said carbon containing precursor is between about 10 seconds and about 20 seconds; and
said selected temperature is between about 400° C. and about 700° C.

25. The method of claim 24 wherein said carbon containing precursor comprises a compound that is selected from the group consisting of a metal alkyl complex and a metalloid alkyl complex, and said titanium containing precursor comprises a titanium halide.

26. A method for making a semiconductor device comprising:
forming a gate dielectric layer on a semiconductor substrate; and
forming a gate electrode on said gate dielectric layer, wherein said gate electrode is comprised of a titanium carbide layer, wherein said titanium carbide layer is formed by alternately introducing a carbon containing precursor and a titanium containing precursor at selected pulse times into a chemical vapor deposition reactor at a selected temperature, and wherein said titanium carbide layer has a mid-gap workfunction.

27. The method of claim 26 wherein:
the selected pulse time for said carbon containing precursor is between about 1 second and about 10 seconds; and
said selected temperature is between about 250° C. and about 400° C.

28. The method of claim 27 wherein said carbon containing precursor comprises a compound that is selected from the group consisting of a metal alkyl complex and a metalloid alkyl complex, and said titanium containing precursor comprises a titanium halide.

29. A method for making a semiconductor device comprising:
forming a trench in a dielectric layer; and
forming a gate electrode on a gate dielectric layer in said trench, wherein said gate electrode is comprised of a titanium carbide layer, and wherein said titanium carbide layer is formed by alternately introducing a carbon containing precursor and a titanium containing precursor at selected pulse times into a chemical vapor deposition reactor at a selected temperature.

30. The method of claim 29 wherein said trench is formed by using a selective etch process to remove a polysilicon gate electrode from said dielectric layer.

31. The method of claim 30 wherein said gate dielectric layer is a high-k gate dielectric layer that comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

32. The method of claim 29 wherein said titanium carbide layer has a p-type workfunction.

33. The method of claim 29 wherein said titanium carbide layer has a workfunction between about 4.9 eV and about 5.2 eV.

34. The method of claim 29 wherein said titanium carbide layer has an n-type workfunction.

35. The method of claim 29 wherein said titanium carbide layer has a workfunction between about 3.9 eV and about 4.3 eV.

36. The method of claim 29 wherein said titanium carbide layer has a mid-gap workfunction.

* * * * *